Figure 1:
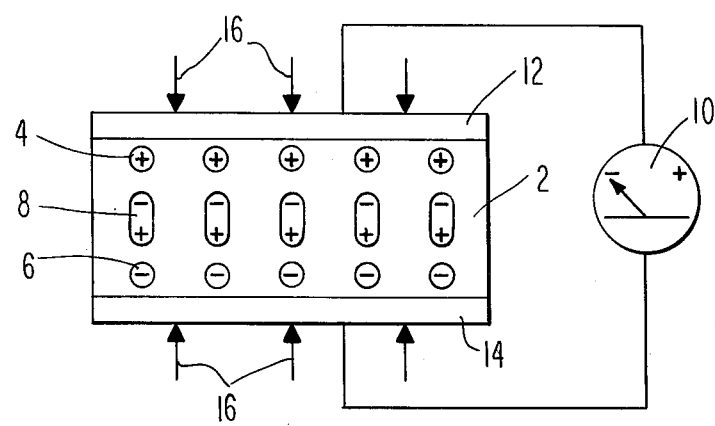

United States Patent [19]
Radice

[11] 4,055,878
[45] Nov. 1, 1977

[54] STABILIZATION OF PIEZOELECTRIC RESIN ELEMENTS

[75] Inventor: Peter Francis Radice, King of Prussia, Pa.

[73] Assignee: Pennwalt Corporation, Philadelphia, Pa.

[21] Appl. No.: 726,381

[22] Filed: Sept. 24, 1976

[51] Int. Cl.² .............................................. H01L 41/22
[52] U.S. Cl. ................................ 29/25.35; 29/592 R; 307/88 ET; 361/233
[58] Field of Search ............................ 29/25.35, 592; 307/88 ET; 310/8, 8.7; 317/262 R, 262 F; 252/62.9; 264/340; 361/233

[56] References Cited

U.S. PATENT DOCUMENTS

| | | | |
|---|---|---|---|
| 3,660,736 | 5/1972 | Igarashi et al. | 307/88 ET X |
| 3,793,715 | 2/1974 | Murayama | 29/592 |
| 3,833,503 | 9/1974 | Murayama et al. | 252/63.7 |
| 3,967,027 | 6/1976 | Igarashi et al. | 307/88 ET X |

Primary Examiner—Carl E. Hall

[57] ABSTRACT

A stabilized piezoelectric resin element is produced by applying high pressure to a poled piezoelectric resin element for a given time and short circuiting the surface of said element under pressure.

16 Claims, 5 Drawing Figures

STABILIZATION OF PIEZOELECTRIC RESIN ELEMENTS

This invention concerns a method of providing a stabilized piezoelectric resin element. More particularly, it concerns a method wherein high pressure is imposed on a poled, piezoelectric resin element while simultaneously short circuiting the surfaces of said element.

Piezo and pyroelectricity is induced in dielectric materials containing permanent electric moments. These moments orient in the direction of the applied electric field. The application of a direct current electric field across a dielectric material is called "poling". The procedure for poling is well known in the art and in the case of dielectric resin films and sheets, generally involves the application of a direct current voltage, e.g., 300 to 1000 kilovolts per centimeter of thickness of dielectric material, to the dielectric resin sheet while first heating the resin sheet to a temperature ranging between just above room temperature to just below the melt temperature of the resin for a period of time and then, while maintaining the potential, cooling the resin sheet.

Poling results in permanent polarization and a heterocharge due to the net dipole orientation, in addition to this effect, real charges are injected and concentrated along the film surface and are of the same sign as the poling electrode and are thus called homocharge. These homocharges can mask the effect of the permanent heterocharge due to the permanent orientation of the dipoles and can produce a false piezoelectricity. These homocharges can remain on a poled dielectric film or sheet for months unless they are removed by some technique.

Various techniques for stabilizing poled piezoelectric resin elements and the necessity therefor have been taught in the prior art. In U.S. Pat. Nos. 3,660,736 and 3,833,503, a heat process for stabilizing electrets having piezoelectric properties is disclosed. In U.S. Pat. No. 3,793,715 a method of stabilizing piezoelectric elements wherein the element is immersed in water, is disclosed.

Accordingly, the present invention is a novel method of providing a piezoelectric resin element having a permanent, true piezoelectricity wherein a poled piezoelectric resin element is subjected to an elevated pressure for a sufficient time to provide a stabilized element having a permanent true piezoelectricity. It is preferred that the elevated pressure be at least about 200 pounds per square inch (p.s.i.) and more preferably at least about 800 p.s.i.

The accompanying drawings are included to more fully explain the invention.

FIG. 1 is a diagramatic representation of a conventionally poled piezoelectric resin element (film) 2 prior to pressure stabilization. Film 2 contains homocharges 4 and 6 as well as heterocharges 8. A test pressure of 10–20 p.s.i. is applied as at arrows 16 to electrodes 12 and 14 and the charge is measured on direct current (d.c.) meter 10. In FIG. 1 a negative charge or false piezoelectricity is indicated due to the presence of real charges or homocharges 4 and 6.

Figure 2:
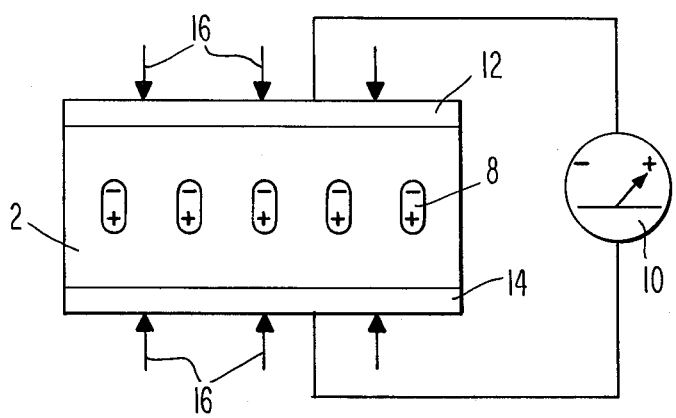

In FIG. 2, the piezoelectric film 2 is shown after stabilization in accordance with this invention. Heterocharges 8 remain to provide a permanent true piezoelectricity as indicated when the test pressure is applied, as shown as at arrows 16, to electrodes 12 and 14 and the charge is measured on d.c. meter 10. True piezoelectric activity is shown by a plus reading on meter 10 due to the dipole charges.

Figure 3:
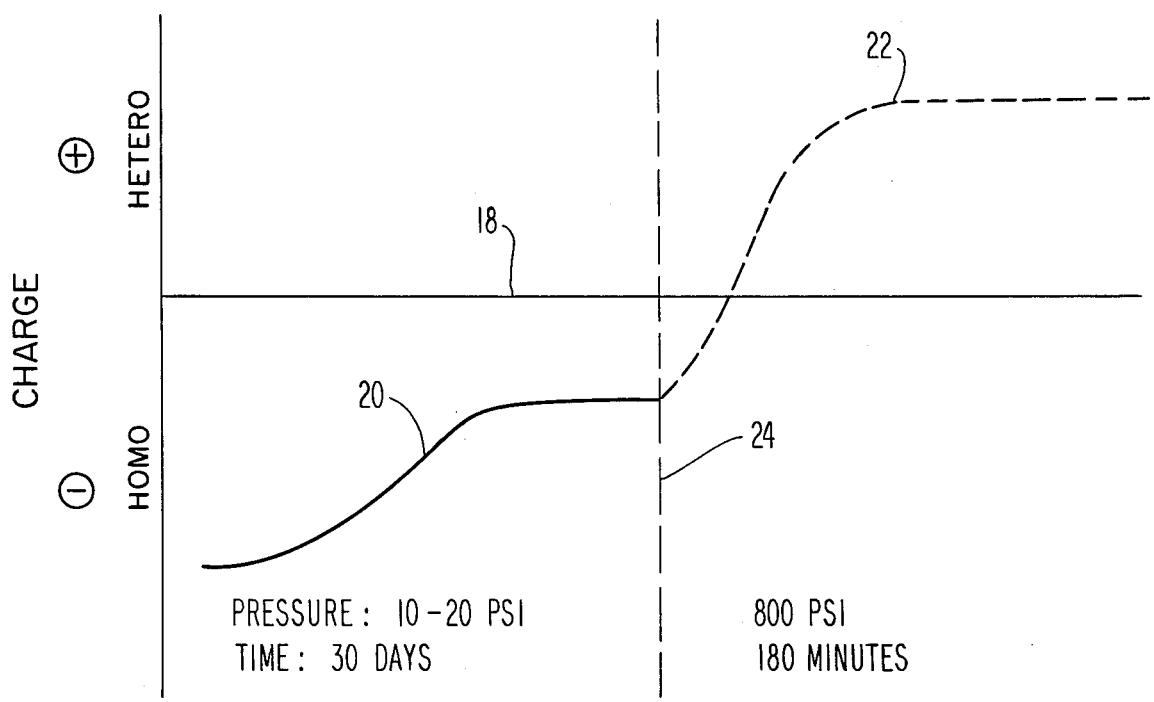

FIG. 3 is a graph of the homocharge decay on a surface shorted, conventionally poled, piezoelectric resin film after both low pressure and high pressure treatment. Horizontal line 18 of the graph represents an apparent zero charge on the film. Line 20 is a curve representing the measured charges on the film over a period of 30 days during which time a low pressure of 10 to 20 p.s.i. had been applied. It can be seen that the curve 20 levels off at a negative charge value indicating the presence of homocharges which mask or block the true piezoelectricity of the film. After 30 days, as represented at vertical dash line 24, a high pressure of 800 p.s.i. is applied to the film and the charge is periodically measured on a d.c. meter. Dash line curve 22 represents the measured charges on the film over a period of 180 minutes. The leveling off of curve 22 at a high positive charge value indicates a permanent true piezoelectricity.

Figure 4:
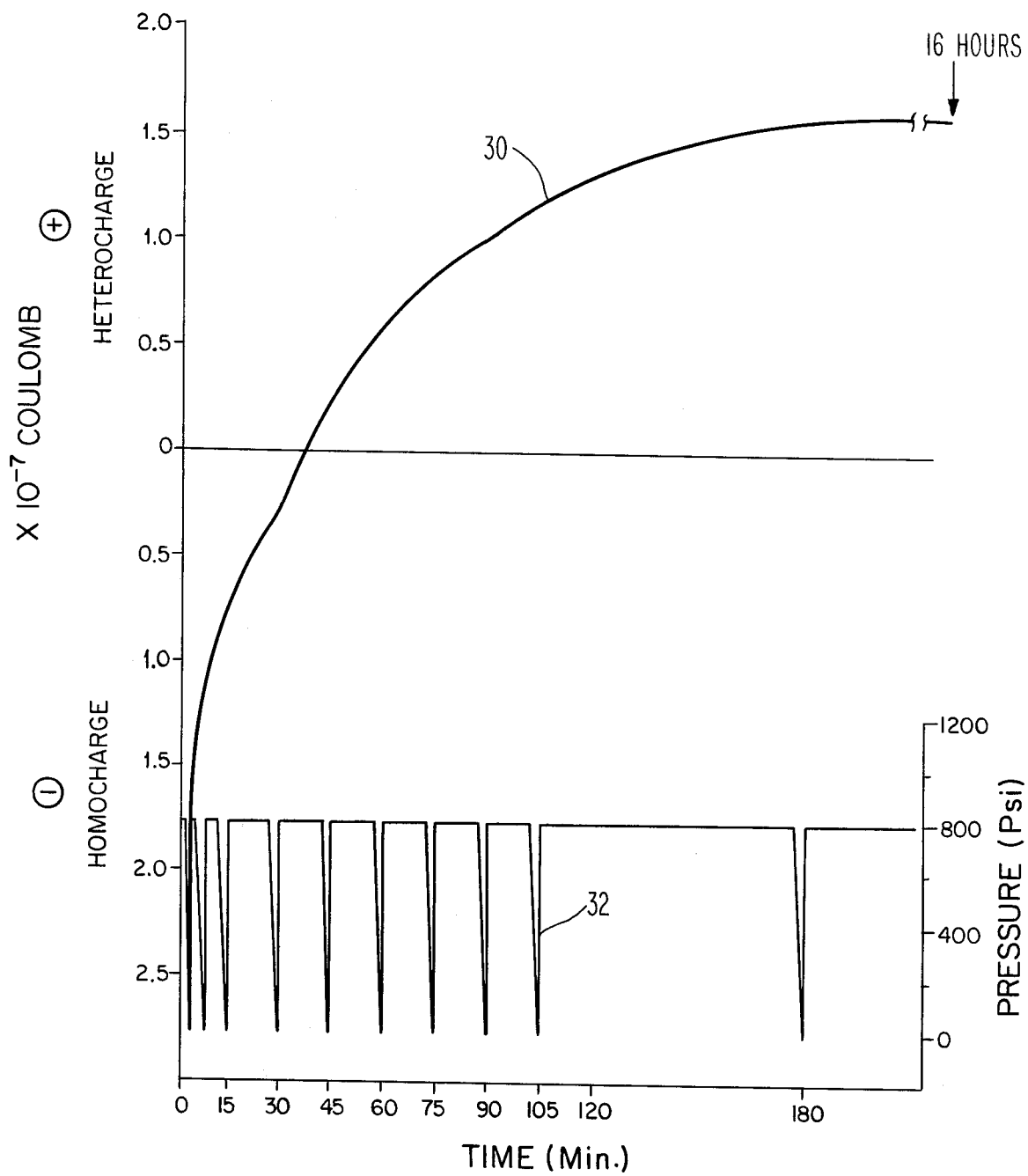

FIG. 4 is a graph of the charge measurement during pressure stabilization of a poled vinylidene fluoride homopolymer film which had been uniaxially oriented by stretching 6 times and had a final thickness of 1.1 mils. The film had been poled by subjecting it to a d.c. voltage of 500 kv./cm. between two electrodes at a temperature of 100° C for 1 hour. The film was permitted to cool under applied voltage. Curve 30 represents the charges on the film measured in $10^{-7}$ coulombs as the time passes during treatment. Pressure drops indicated, for example, at 32 designate the points of brief removal and reapplication of high pressure from the film in order to periodically measure the apparent piezoelectric constant produced. As the charge on the film is measured over 180 minutes the curve 30 rises until at 180 minutes it reaches a level-off or stabilized charge and remains at that stabilized true piezoelectric value when checked periodically over 16 hours. When stabilized, this film had a piezoelectric constant ($d_{33}$) of 9.5 picocoulombs per Newton.

Figure 5:
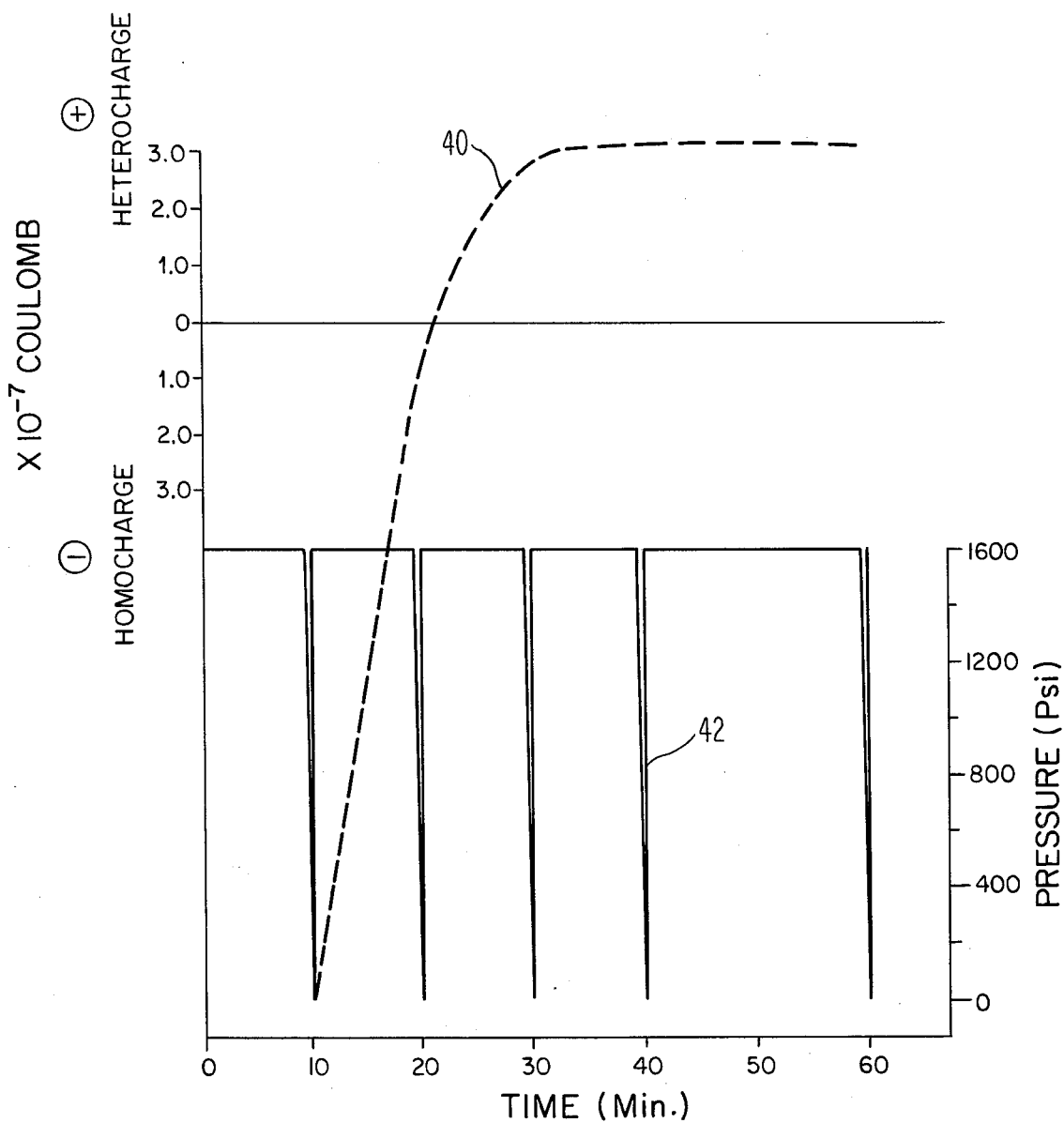

In FIG. 5, the graph represents the high pressure stabilization of a vinylidene fluoride homopolymer film which had been uniaxially oriented by stretching 6 times and had a thickness of 1.1 mils. This film was conventionally poled by charging it between two electrodes at a d.c. voltage of 600 kv./cm. while maintaining its temperature at 100° C for 1 hour and then cooling while maintaining the potential. Curve 40 represents the peridic measurement of the charge on the film developed under a pressure of 1600 p.s.i. Pressure drops, for example at 42, designate the intervals when the pressure was briefly removed and reapplied for measuring the apparent piezoelectric constant produced. It can be seen that curve 40 levels off at about 30–40 minutes of high pressure application and then remains stable at a plus reading of $3 \times 10^{-7}$ coulombs. After metallizing and two months aging the film had a piezoelectric constant ($d_{33}$) of 8.5 picocoulombs per Newton and has remained stable for many months.

The resin element used in the method of this invention may be any shape for a useful piezoelectric material. It is preferably flat or pellicular; for example a film or sheet of uniform thickness.

Piezoelectric resins are those resins which demonstrate a piezoelectric and/or pyroelectric effect when elements thereof have been poled. Examples of such resins are disclosed by Kawai in the Japanese Journal of Applied Physics, Volume 8 (1969) pages 975-976. Kawai disclosed, among others, poly (vinylidene fluoride), poly (vinyl fluoride), poly (vinyl chloride) and polycarbonate resins in this article. Polyamides resins are known to have piezoelectric properties when poled. It is also know that vinylidene fluoride copolymers and blends of the above resins and other resins e.g., poly (methyl methacrylate) resin, demonstrate a piezoelectric effect when poled. Especially useful are copolymers of from about 65 to 75 weight percent vinylidene fluoride with about 35-25 weight percent tetraflurorethylene, vinyl chloride, vinyl fluoride or mixtures thereof. In general, polymers of at least 65 mol percent vinylidene fluoride with from 0 to 36 mol percent of at least one other copolymerizable monomer are useful. As is known in this art, polymers consisting of all or a high proportion of beta crystals provide the highest piezoelectric and pyroelectric properties.

Piezoelectric properties in resin elements, particularly films, can be advantageously influenced by various physical treatments, e.g., orientation either monoaxial, biaxial or multiaxial as is well known in the film art.

The piezoelectric elements are preferably coated on both sides with thin electrically conductive coating prior to poling although they may remain without permanent electrode coatings until well after the stabilizing treatment. Application of conductive coatings is made by conventional means, for example by vapor deposition, painting, electroplating, sputtering laminating and the like. Examples of conductive coatings include various metals or metallic oxides as are well known in this art.

As previously stated, the pressure which must be applied for the method of this invention is suffficient in amount and time to provide a stabilized piezoelectric element. A stablizied piezoelectric element is one which has a permanent, true piezoelectricity or moe specifically, one which demonstrates a stable piezoelectric constant ($d_{33}$) with time. The preferred pressure is at least about 200 p.s.i. and more preferably at least about 800 p.s.i. To stabilized the piezoelectric element in as short a time as possible, higher pressures up to about the deforming pressure of the resin may be used although some deformation of elements e.g., films and sheets, can be tolerated as long as the usefulness of the element is not greatly impaired.

The method of this invention may be carried out at any temperature which does not cause substantial deformation at the pressure employed. Temperatures within the range of just above room temperature to about 120° C preferred. However, since this method works well without the application of external heat, no external heating is necessary.

The surfaces of the piezoelectric element are electrically short circuited while high pressure is applied to the element. That is, an electrical connection is made between oppositely charged surfaces of the element under pressure to eliminate the surface charges (homocharges). If desired, grounding of the short circuited surfaces may also be employed.

While the invention has been described for the pressure stabilization of a single film or pellicle, it is also applicable to the pressure stabilization of multiple films or pellicles in a stack such that a multiply stack ie., at least two plies, of the same or chemically different poled piezoelectric pellicles being uncoated or having one or both sides coated with electroconductive coatings eg., vapor deposited metallic coatings, may be subjected to high pressure, as described herein, while the upper and lower surfaces of the stack are shorted to remove the collected surface charges. Under such a condition, the entire stack may be considered to be one thick piezoelectric sheet. On separation of the plies or sheets of the stack, each will be stabilized or demonstrate true piezoelectricity.

As shown by the graphs of FIGS. 4 and 5 of the drawings, the stabilization of the piezoelectric resin element need not be carried out by subjecting the element to continuous pressure until stablization is complete. The application of pressure on an intermittent basis wherein pressure is applied, released and reapplied for a time sufficient to provide a cummulative effect of eventual stabilizatiion is also considered to be an aspect of this invention. It is seen that the process of this invention may be carried out in a continuous manner where the poled piezoelectric resin element, preferably a film or sheet, is subjected to pressure under or between pressure rollers in series.

I claim:

1. A method of stabilizing a poled piezoelectric resin element comprising applying pressure in excess of 20 p.s.i. to said element while its surfaces are electrically short circuited, said pressure being applied in an amount and for a time sufficient to provide a stabilized piezoelectric element.

2. The method of claim 1 wherein said pressure is at least 200 p.s.i.

3. The method of claim 1 wherein said pressure is at least about 800 p.s.i.

4. The method of claim 1 wherein said resin is heated to a temperature within the range of from just above room temperature to about 120° C.

5. The method of claim 1 wherein said resin is a polymer of at least 65 mol percent vinylidene fluoride and from 0 to 35 mol percent of at least one other copolymerizable monomer.

6. The method of claim 5 wherein said resin is a copolymer of about 65-75 weight percent vinylidene fluoride and about 35-25 weight percent of tetrafluoroethylene.

7. The method of claim 1 wherein said piezoelectric element has permanently adhering electroconductive surfaces on at least one side thereof.

8. The method of claim 7 wherein said piezoelectric resin element is a film and said pressure is at least 200 p.s.i.

9. The method of claim 8 wherein said resin is a polymer of at least 65 mol percent of vinylidene fluoride and from 0 to 35 mol percent of at least one other copolymerizable monomer.

10. The method of claim 9 wherein said pressure is at least about 800 p.s.i.

11. The method of claim 9 wherein said pressure is at least about 1600 p.s.i.

12. The method of claim 9 wherein said film is oriented in at least one direction.

13. The method of claim 9 wherein said resin is a copolymer of about 65-75 weight percent of vinylidene fluoride and about 35-25 weight percent of tetrafluoroethylene.

14. The method of claim 9 wherein said resin is a homopolymer of vinylidene fluoride.

15. The method of claim 9 wherein the resin is heated to a temperature within the range of from just above room temperature to about 120° C.

16. The method of claim 11 wherein the pressure is applied for a total time of at least about 30 minutes.

* * * * *